United States Patent [19]

Neftin

[11] Patent Number: 5,661,341
[45] Date of Patent: Aug. 26, 1997

[54] METHOD OF MANUFACTURING A COMPOSITE STRUCTURE FOR USE IN ELECTRONIC DEVICES AND STRUCTURE, MANUFACTURED BY SAID METHOD

[75] Inventor: Shimon Neftin, Kiriat Shmona, Israel

[73] Assignee: Microcomponents and Systems Ltd., Misgav, Israel

[21] Appl. No.: 471,975

[22] Filed: Jun. 6, 1995

[30] Foreign Application Priority Data

Jul. 25, 1994 [IL] Israel ......................................... 110431

[51] Int. Cl.$^6$ ....................................... H01L 23/04
[52] U.S. Cl. ............................. 257/698; 257/692
[58] Field of Search ........................... 257/692, 698, 257/707, 786, 700, 701, 702

[56] References Cited

U.S. PATENT DOCUMENTS

| 5,055,907 | 10/1991 | Jacobs | 257/786 |
| 5,198,693 | 3/1993 | Imken et al. | 257/707 |
| 5,463,250 | 10/1995 | Nguyen et al. | 257/692 |
| 5,508,556 | 4/1996 | Lin | 257/698 |

FOREIGN PATENT DOCUMENTS

| 1 584 094 | 11/1969 | France . |
| 2 459 557 | 1/1981 | France . |
| 2 466 103 | 3/1981 | France . |
| 281 076 A1 | 7/1990 | Germany . |
| 470 760 | 5/1969 | Switzerland . |
| WO 95/08841 | 3/1995 | WIPO . |

OTHER PUBLICATIONS

International Search Report PCT/GB95/01630 dated 4 Oct. 1995.

*Primary Examiner*—Mahshid D. Saadat
*Assistant Examiner*—S. V. Clark
*Attorney, Agent, or Firm*—Wigman, Cohen, Leitner & Myers, P.C.

[57] ABSTRACT

A method for manufacturing of a composite microelectronic structure with improved planarity of layers thereof.
The method comprises masking of selected portion of electrically conductive layers with subsequent selective electrochemical anodic oxidation thereof and removing the mask. A composite structure, in particular MCM-D's manufactured by this method has improved connectivity density and performances.

5 Claims, 5 Drawing Sheets

METHOD OF MANUFACTURING A COMPOSITE STRUCTURE FOR USE IN ELECTRONIC DEVICES AND STRUCTURE, MANUFACTURED BY SAID METHOD

FIELD OF THE INVENTION

The present invention relates mainly to the field of semiconductor technology, particularly to the fabrication of substrates, carriers and packages for different electronic devices incorporating semiconducting VLSI chips, including a multilayer wiring board, requiring high density and high performance for interconnection circuitry.

More particularly, this invention relates to the technology of manufacturing multichip modules (MCM) having a composite multilayered structure, consisting of electrically conductive and nonconductive films, constituting wiring.

The present invention also refers to a new composite structure, manufactured in accordance with this technology and to its implementation in different electronic subsystems and devices, based on multichip modules.

BACKGROUND OF THE INVENTION

Since the 1940s, when the printed circuit board emerged, development of new electronic packages has been associated with a continuous increase in circuit density.

To satisfy this requirement and to enable adequate realization of performance advantages, associated with modern VLSI semiconductor devices, multichip module technology has been developed, providing for an increase in interconnection density, accompanied by simultaneous size reduction of the package.

Despite the first multichip modules having emerged in the late 1970s, this technology is developing very extensively, and today there are known numerous multichip modules and various methods for their manufacturing, which are described in different publications, including books, patents, scientific articles, catalogs, etc.

A comprehensive survey of multichip module technology can be found, for example, in the monograph "Thin film multichip modules" by George Messner, Iwona Turlik, John W. Balde and Philip E. Garrou, edited by the International Society for Hybrid Microelectronics, 1992.

In accordance with basic definition and classification, given in this monograph the multichip module is a device, which provides the interconnections for several chips that are subsequently protected by a coating or an enclosure.

In accordance with different approaches and fabrication techniques the MCMs known today can be divided into 3 main groups:

MCM-C are multichip modules which use sinterable metals to form the conductive patterns of signal and power layers, which are applied onto a substrate made of ceramic or glass-ceramic material MCM-L are multichip modules which use laminate structures and employ printed circuit technologies to form a pattern of signal and power layers, which are applied onto layers made of organic insulating material.

MCM-D are multichip modules on which layers of metal and insulator are usually formed by the deposition of thin film onto a rigid support structure usually made of silicon, ceramic, or metal.

FIG. 1 illustrates schematically the structure arranged on a substrate of a general type MCM. This structure includes electrically conductive regions (signal layers, conductor, power layer) and insulating regions arranged in accordance with certain pattern on the substrate.

The conductive regions, referring to adjacent layers can merge so as to form so-called vias.

Parameters, which are of importance for the performance of such an MCM include, inter alia, material of an electrically conductive region, the thickness of the respective layer t and width thereof and degree of planarisation of adjacent layers. The last two parameters are shown schematically on FIG. 2 presenting an enlarged part of the structure illustrated in FIG. 1 and referring to known, in the prior art, MCM structures and particularly to a typical Polyimide or SiO2 MCM.

One can see that there are two types of nonplanarity inherent to this structure. The first type is associated with the via zone; the second one with the zone adjacent to any insulating region (conductor zone). Despite the fact that in FIG. 2 only one set of conductor-insulator layers is shown it should be understood, that in practice a multilayered structure can be realized. The degree of planarity will be defined as follows:

a) for the via zone: $\Delta 1$ denotes the via etch depth, t the thickness of the conducting layer and the planarity degree (PD) in % is $PDv=\Delta 1/t*100$. It can be readily understood, that degree of planarity is better as PD value diminishes.

b) for the conductor zone: $\Delta 2$ denotes the difference in thickness of adjacent conductive and nonconductive regions; degree of planarity is defined in similar manner as $PDc=\Delta 2/t*100$.

FIG. 3 shows schematically parameters presented in FIG. 2 in connection with the present invention and it will be shown further how these parameters can be improved by virtue of the present invention. Here t refers to thickness of regions belonging to first conductive layer (conductor) and $\Delta 1$ and $\Delta 2$ refers respectively to degree of nonplanarity of insulating region (insulator) in a via zone and in a conductor zone.

Each of the above listed MCMs is defined by structural parameters, inherent to general structure, shown in FIG. 1, however characteristics of these parameters are different, depending on the particular type of MCM. Each of them has its own advantages and disadvantages with respect to manufacturing costs and performance.

Table 1 below compares typical dimensional and structural parameters of L-, C- and D-type MCM's.

TABLE 1

|  | MCM-L | MCM-C | MCM-D |
|---|---|---|---|
| Substrate Material | Organic | Alumina | Silicon Alumina |
| Electrical conductive regions | | | |
| -Material | Cu | W/Mo, Ag/Pd | Cu/Al |
| t -Thickness (micron) | 10–50 | 20–50 | 1–5 |
| w -Width (micron) | 75 | 100 | 10 |
| Electrical insulating regions | | | |
| -Material | Organic | Alumina | PI |
| t -Thickness (micron) | 200–500 | 50–100 | 10–70 |
| -Via (micron) | 150 | 100–200 | 25 |
| Dielectric Constant | 4–5 | 7 | 4 |

The present invention will be disclosed further in connection with the last category of MCMs, i.e. MCM-D's made by the thin film fabrication method, in which a continuous thin film consisting of metallic material, is treated so as to convert selected regions thereof into dielectric regions. It will be shown further how by virtue of the present invention the above mentioned parameters, listed in table 1 and inherent to known MCM-D's are improved.

One of popular methods for the manufacture of MCM-D is based on the formation of dielectric polyimide layers onto patterned metallic layers (usually Cu, Al) with typical thickness of 1–3 microns, by means of spinning and subsequent curing and polymerization thereof.

Despite the relatively high degree of planarity of the insulating regions achieved within the polyimide layers adjacent to conductor zones (low value of $\Delta 2$) this method is associated with inherently insufficient planarization of the via zones (high value of $\Delta 1$), which my result in limited resolution and inferior performance.

Moreover it should be pointed out that poor thermal conductivity of polymeric materials is insufficient for utilization of chips, in which functioning is associated with substantial heat generation.

It should be pointed out that planarization is extremely critical for the reliable performance of MCM structures and required degree thereof can be obtained in this method only through the use of expensive planarizing organic dielectric material or by mechanically or chemically polishing (etching away) the dielectric surface until a planar surface is obtained.

The inevitable consequence of these additional operations is associated with increased cost and reduced yield, since these operations may impair thin film surface structure and therefore a very thorough and sophisticated testing procedure might be required to ensure reliable performance of such a structure. An example of such a fabrication method can be found in U.S. Pat. No. 5,055,907, assigned to Mosaic Inc.

Another known method for manufacturing MCM-Ds is based on the depositing of SiO2 film, which serves as an insulating barrier, separating between adjacent metallic conductive layers.

The disadvantage of this method lies in the necessity to carry out separately the via formation step and is associated therefore with extra costs and reduction in yield.

It should be pointed out, that the degree of planarization, ultimate via diameter and resolution, achievable in this method, are limited.

An additional disadvantage, inherent to this method, is associated with employing of a chemical reagent such as fluoric acid, which is dangerous. Special measures may also be required for the prevention of environmental pollution problems.

There is also mother known method for the manufacture of MCM-Ds It is based on the formation of thin films, consisting of interspersing regions of dielectric alumina and aluminium created within a substrate made of aluminium. This method is disclosed in the East German Patent DD 281076, assigned to VEB ROBOTRON-BUCHUN.

The multichip module, described in this document comprises a ceramic substrate and applied thereon upper layers of aluminium provided with an Al-conductor pattern, formed by etching through a mask. This pattern includes conductive regions, insulated there between by nonconductive aluminium oxide regions, formed by spark discharge anodic oxidation.

The manufacturing method, used for fabrication of this MCM-D is based on so called subtractive etching through a patterned layer of photoresist and is defined by repetition of the following main sequence of steps:

formation of a first photoresist mask onto the aluminium layer etching of the aluminium layer and removing the mask forming a second photoresist mask and formation of vias subsequent anodic oxidation of exposed regions of aluminium layer and removing the photoresist mask complete covering with a new aluminium layer simultaneous etching of a new aluminium layer and of anodically oxidized regions so as to achieve planarization of oxide and nonoxide regions.

The known process is complicated and costly.

The other drawback, inherent to this method is associated with the necessity of subtractive etching, which permits only limited degree of planarization, since this procedure might deteriorate the thin film surface.

The inherent drawback, associated with etching is obtaining of sidewalls, sloping by 45 degrees and therefore compromising the maximum density of functional track, created within the same layer.

Furthermore, since the etching procedure usually requires relatively strong acids, it can be assumed that practical implementation of this manufacturing process will be associated with complicated measures which are necessary to prevent environment pollution.

It should be pointed out, that the spark erosion process does not allow for obtaining of oxided regions with a thickness of more than 0,1 micron, which might be insufficient for electrical insulation in some cases.

OBJECT OF THE INVENTION

The object of the present invention is to provide a method for manufacturing a composite structure, substantially for use in MCM-Ds, as well the structure, fabricated by this method in which the above mentioned deficiencies of the known methods and structures are significantly reduced or overcome.

In particular, the main object of the present invention is to provide a new method for the fabrication of MCM-Ds resulting in high density of interconnection lines and high resolution.

The second object of the present invention is to provide a new and improved method for the fabrication of MCM-Ds in which improved degree of planarization is achieved without subtractive etching or my additional steps which could deteriorate the surface of planarized layer.

The third object of the present invention is to provide a new and improved method for the fabrication of MCM-Ds which is simple, consists of a reduced number of steps, is not expensive and does not reduce production yield.

A further object of the present invention is to provide a new and improved method for the fabrication of MCM-Ds which does not require the use of dangerous chemical reagents and is environmentally safe.

A still further object of the present invention is to provide a new composite structure for use in MCM-Ds which has improved thermal conductivity, improved heat dissipation and allows for the incorporation of semiconducting devices, which generates large amounts of heat during their functioning.

Another object of the present invention is to provide a new multichip structure in which the sidewalls of insulating regions are substantially perpendicular to the surface or respective layer.

The above and other objects and advantages of the present invention can be achieved in accordance with the combination of its essential features, as defined below.

A method for manufacturing a composite structure, substantially for use in different electronic devices, said structure initially comprising at least one continuous electrically conductive layer.

Said method includes the following main sequence of steps:

masking of at least one selected portion of the surface of said electrically conductive layer so as to form a first mask thereon said mask being provided with the appropriate preselected pattern so as to hide the first group of selected locations of said layer and to expose the second group of selected locations thereof, selective oxidation, directed substantially in depth of said electrically conductive layer via said mask so as to convert said exposed selected locations, and bulk of said layer situated therebeneath into nonconductive regions without, however oxidation of said selected hide locations so as to leave situated therebeneath the bulk of said layer as conductive regions.

removing said first mask so as to enable planarization of levels of said oxidized electrically nonconductive regions with levels of nonoxidized electrically conductive regions.

In accordance with one of the preferred embodiments, said continuous electrically conductive layer consists of aluminium, said mask is formed by means of photolithography preferably by means of exposing of a layer made of appropriate photosensitive material; oxidation of said continuous electrically conductive layer is carried out by means of electrochemical anodic oxidation so as to avoid protruding of said nonconductive regions above the surface of said continuous electrically conductive layer.

In another preferred embodiment of said method it additionally includes:

covering said planarized conductive and nonconductive regions by an additional initially continuous electrically conductive layer, repeating said main sequence of steps, while masking each additional layer with a mask having a preselected pattern, preferably different from that of said first mask.

In still a further preferred embodiment said additional continuous electrically conductive layer consists of a thin film of aluminium, having thicknesses of 0,5–5 microns, preferably being 2 microns and said layer is applied by appropriate thin film deposition method.

In a further preferred embodiment, said selective oxidation is carried out by electrochemical anodic oxidation in a solution chosen from the group comprising at least one weak organic or inorganic acid, e.g., boric acid, formic acid, citric acid, acetic acid, etc., or their combination.

As per yet another preferred embodiment, electrical parameters of selective oxidation are chosen in such a manner that said electrically nonconductive regions formed within at least some of the additional layers, have different depth and/or density.

In a further preferred embodiment, selective oxidation of the first initially continuous electrically conductive layer is carried out so as to achieve deeper oxidation thereof, than of additional layers.

In another preferred embodiment, electrical parameters for selective oxidation of at least some of the initially continuous electrically conductive layers are chosen as follows:

voltage is progressively increased with constant gradient 1–2 v/sec from 0 up to 40 v oxidation is maintained at constant voltage until establishing a current density of 1–2 amper/dm$^2$, corresponding to formation of oxidised regions, transversely extending in depth of respective initially continuous layer.

In a method performed according to additional preferred embodiment, oxidation of at least one of said additional layers is carried out so as to form therein nonconductive regions having density substantially equal to that of the nonconductive regions formed in said first initially continuous electrically conductive layer.

As per yet another preferred embodiment, electrical parameters for selective oxidation of at least some of said additional electrically conductive layers are chosen so as to form electrically nonconductive regions, having a density which exceeds that of nonconductive regions formed within said first initially continuous electrically conductive layer.

In a further preferred embodiment of said method, electrical parameters for selective oxidation of at least some of said additional layers are chosen as follows:

voltage is progressively increased with constant gradient 1–2 v/sec from 0 up to 150–300 v oxidation is maintained at constant voltage for a period of time, sufficient for establishing a current density of 0,05–0,07 amper/dm$^2$, corresponding to the formation of oxidised regions, transversely extending in depth of respective layer.

According to an alternative embodiment of the present invention, referring to a composite structure for use in different electronic devices, said structure is defined by the following features:

at least one first layer, consisting of a plurality of electrically conductive regions, interspersing with electrically nonconductive regions; said regions are arranged in accordance with preselected pattern and extend laterally and transversely within said layer said electrically conductive regions are made of metallic material, preferably of aluminium; said electrically nonconductive regions constitute a product of the conversion of said metallic material in electrically nonconductive form thereof, preferably alumina.

The structure is further characterized in that said conductive and nonconductive regions extend in depth of said layer, substantially transversely with respect to the outwardly facing surface thereof and are substantially co-planar therebetween.

In a further preferred embodiment, referring to the composite structure, it comprises a substrate, made of ceramic or nonceramic material, e.g., alumina, silicon, aluminium nitride or the like and said layer is arranged thereon.

In another preferred embodiment, this structure comprises at least one additional layer, having a thickness preferably less than that of said first layer and consisting of a combination of electrically nonconductive regions, interspersing with electrically conductive regions, while said regions are arranged in accordance with the preselected pattern, which differs from that of said first layer and density of nonconductive regions of at least some of the additional layers exceeding that of the first layer.

In another preferred embodiment, said composite structure constitutes a D-type substrate for a multichip module and at least some electrically conductive regions thereof are arranged so as to provide vias.

And still in a further preferred embodiment, said composite structure constitutes both substrate and package, integrated together.

The present invention in its various embodiments has only been summarized briefly. For a better understanding of the present invention as well of its advantages, reference will now be made to the following description of its embodiments, taken in combination with accompanying drawings, tables and examples.

DETAILED DESCRIPTION OF SPECIFIC EMBODIMENTS

Figure 1:
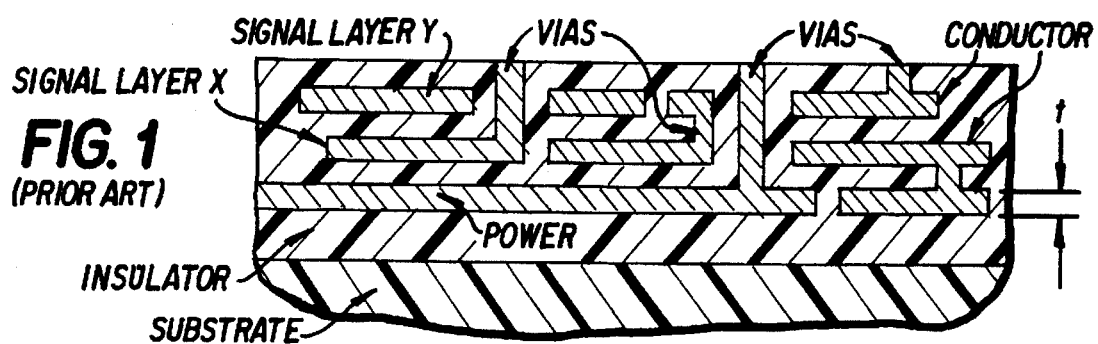
FIG. 1 schematically shows a general type MCM structure.
Figure 2:
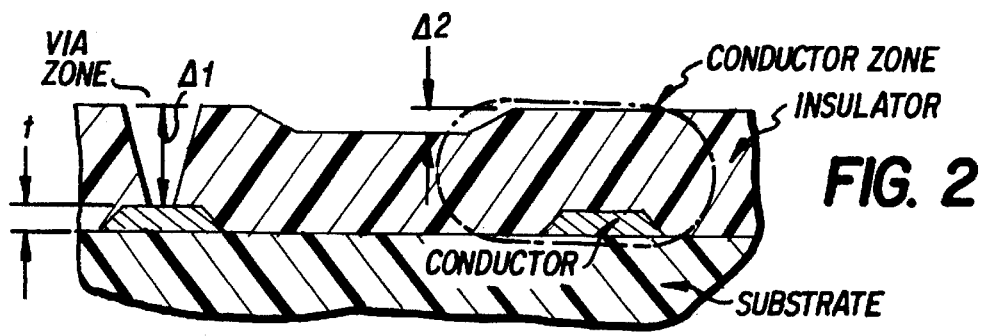
FIG. 2 is a schematic presentation of planarity-related structural parameters of two-layer structure, for MCM, of D-SiO$_3$ or D-polyimide type.

Referring to FIG. 1, there is shown a typical MCM-substrate, with arranged thereon power and signal layers, insulated therebetween by means of appropriate insulation layers. On the surface of this substrate one or several bare semiconductor chips, resistors or other functional elements can be assembled.

FIGS. 4–13 illustrate the flow chart and sequence of steps of the manufacturing method suitable for fabrication of an MCM-D in accordance with the present invention.

The method comprises the first group of steps, constituting the main sequence thereof, to be effected in the beginning of the process and the second sequence of steps, carried out afterwards and resumed amount of times, depending on the required MCM-D structure. With reference to FIGS. 5–8 the main sequence of steps comprises:

providing of a continuous electrically conductive layer 20 on a substrate 10 masking this layer by a first mask 30 selective anodic oxidation of layer 20 through mask 30 within an appropriate galvanic vessel 40 cleaning and inspection.

The suitable substrate can be ceramic or nonceramic material, e.g., alumina, silicon, etc. The electrically conductive layer can be formed thereon by conventional methods, suitable for deposition of a thin metallic film with thicknesses of 0.5–5 microns onto the nonmetallic substrate.

The present invention will be disclosed further, mainly with reference to an electrically conductive layer made of aluminium, however, it should be understood that for implementation of the present invention one can use other metallic materials as well.

In practice, the thickness of this layer is 1–2 microns and can be easily achieved, for example, by an appropriate, known-in-the-art vacuum deposition technique.

Figure 5:
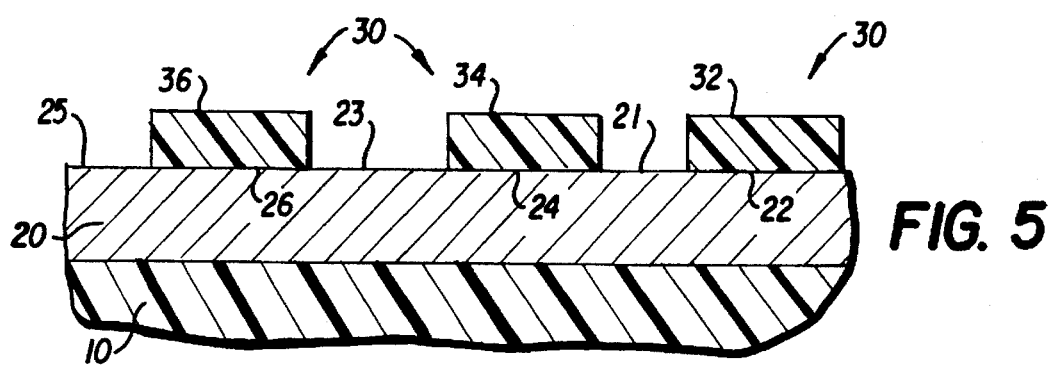
FIG. 5 schematically shows how the preselected pattern is defined by the first mask applied on the surface of initially continuous electrically conductive layer.

In FIG. 5 there is shown a separate substrate with a film deposited thereon, constituting such a continuous electrically conductive layer.

Figure 14:
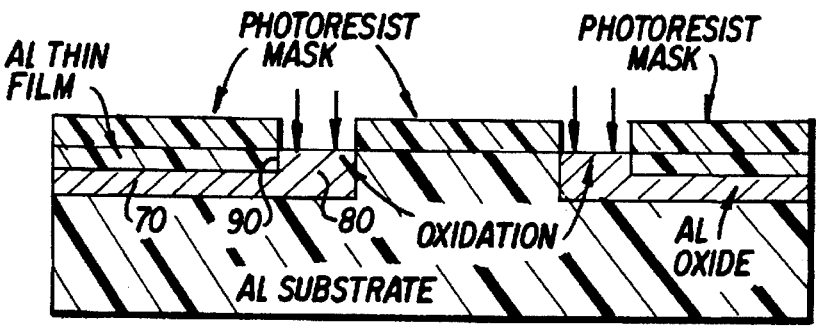

It should also be understood that the substrate can likewise be formed as a single piece, wholly consisting of an electrically conductive material; in this case there is no need for deposition of the metallic film thereon. This embodiment will be referred to later on and is shown in FIG. 14.

Figure 4:
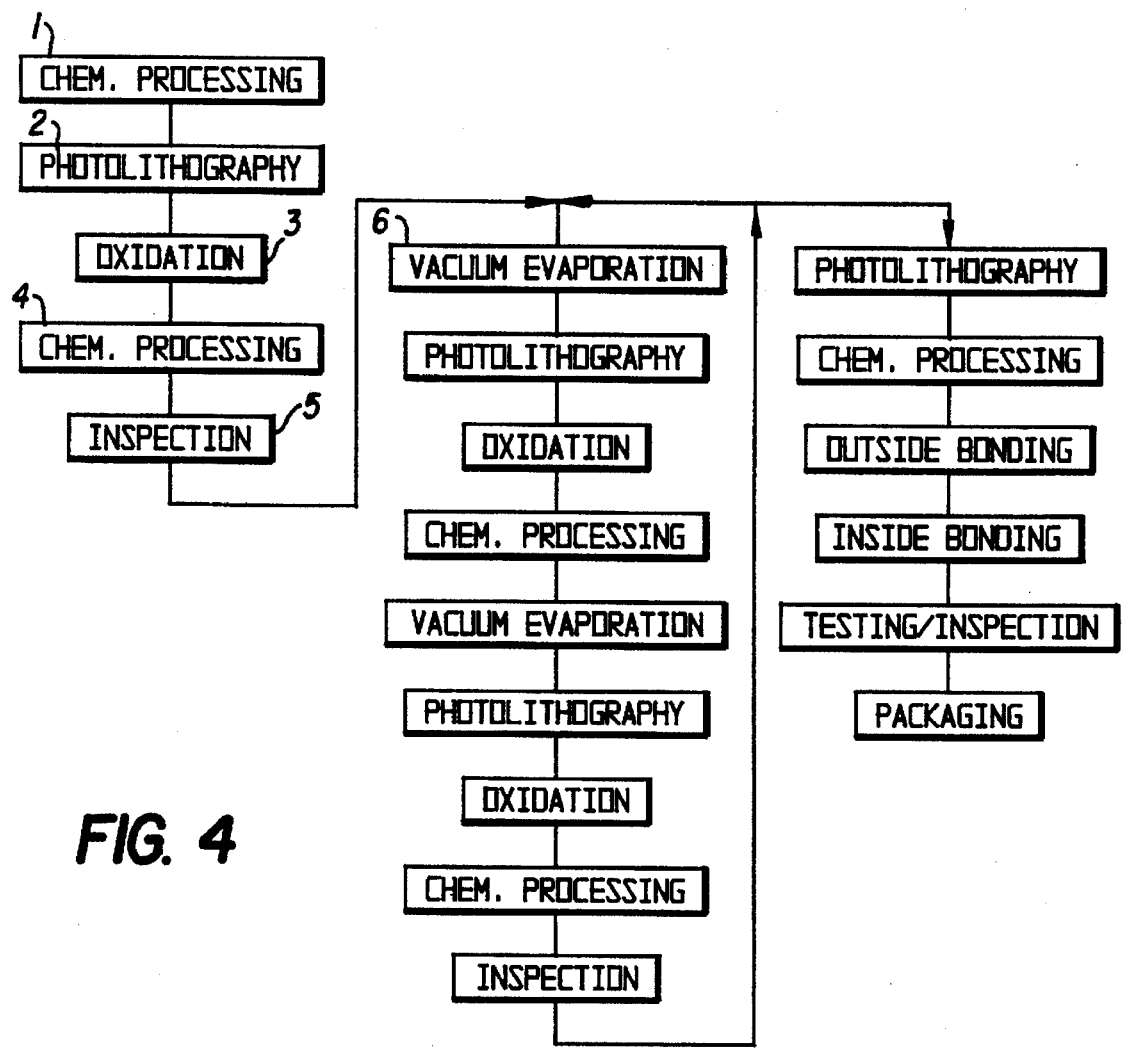
FIG. 4 presents a flow-chart for the MCM-D fabrication process in accordance with the present invention.

In the chart shown in FIG. 4, the procedure associated with the formation of a continuous metallic layer is designated as processing chemical and the numeral 1 refers thereto. The second step of the main sequence is associated with the masking procedure which can be carried out by any suitable known-in-the-art masking technique, so as to cover at least part of the outwardly facing surface of layer 20 with a first mask, having a particular preselected pattern. For example, it might be advantageous for this purpose to use a conventional photolithographical method. This method may include spinning deposition on layer 20 of the appropriate transparent photosensitive film with subsequent drying thereof. It should be understood, however, that other known-in-the-art photolithographic techniques can be employed for this purpose as well.

The dried film is then exposed to an ultraviolet light beam, passing via the quartz screen, coated by a thin chromium film, carrying etched thereon a negative mirror image of the mask pattern, to be created on the surface of layer 20.

After exposure of the photoresis layer is completed this layer is conventionally chemically treated so as to obtain thereon the required positive pattern, corresponding to that of the first mask 30.

The above described masking step is designated in FIG. 4 as photolithography and the numeral 2 refers thereto.

It can be readily appreciated that by virtue of the mask pattern the surface of layer 20 includes the first group of selected locations, consisting of a plurality of exposed locations 21,22,23 and the second group of selected locations consisting of plurality of hidden locations 22,24,26, situated under the corresponding pattern regions 32,34,36 of mask 30.

A further step of the main sequence is associated with the conversion of exposed locations of layer 20 into nonconductive insulating regions. In accordance with the present invention this step is carried out by means of selective anodic oxidation of the masked layer within vessel 40, filled with appropriate electrolytic solution 41.

For effecting this step there is provided a dedicated cathode while substrate 10 with masked conductive layer 20 constitutes the mode. Cathode and anode are immersed into solution 41 and together with the appropriate source of electrical current (not shown) they constitute a galvanic cell, in which selective oxidation of exposed locations of anodic surface takes place, accompanied by their conversion of these locations into nonconductive regions. It should be understood that if the electrically conductive layer 20 is made of aluminium the converted nonconductive regions will consist of alumina. However, if the electrically conductive layer is made of another metallic material, the converted nonconductive regions will be the respective oxide thereof.

This step is designated in FIG. 4 as oxidation and the numeral 3 refers thereto. Particular details, referring to electrical parameters of this step will be explained later on.

After completing the oxidation step the initially continuous electrically conductive layer 20 consists of two group of regions. The first group consists of nontransformed electrically conductive regions 22,24,26, which were hidden by respective mask pattern regions 32,34,36 and therefore did not undergo transformation.

The second group of regions, which intersperse with those of the first group, consist of nonconductive regions 21',23', 25' which resulted from oxidation of the respective exposed locations 21,22,23.

Since the only locations participating in the oxidation process were those, situated on the outwardly facing surface of layer 20, the oxidation process is substantially directed in the depth of this layer. This process results in formation of the oxidized regions, extending from the outwardly facing surface of layer 20 towards the bulk thereof. It will be shown further that by varying of the relevant process parameters and/or composition of the electrolytic solution 41 the depth and/or density of nonconductive regions can be effectively controlled.

For those cases when layer 20 is made of aluminium and is deposited on a substrate, made of material which is not aluminium, the oxidation is effected in depth of this layer, until the full bulk thereof will be oxidized.

If the substrate itself is made of aluminium and in fact constitutes the first continuous electrically conductive layer the anodic oxidation thereof is effected until electrically insulating regions with required depth are achieved, without, however, oxidation of the entire bulk of the substrate.

Figure 8:
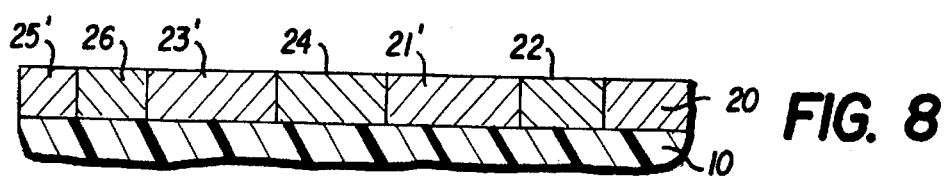

After completing of the oxidation step, the remaining mask regions, are removed by appropriate conventional chemical processing, so as to achieve planarization of levels of oxidized regions 21',23',25' with those which did not undergo conversion. The resulting composite structure is shown in FIG. 8. It will be realized, that the bulk thereof consists of nonconverted conductive regions, situated beneath locations 22,24,26 and of converted insulating regions.

It will also be appreciated that, since insulating regions extend substantially in depth of layer 20 without, however, protruding thereabove, planarization can be easily accomplished by simply removing the mask regions, without employing etching away or any other measures, which otherwise could impair the surface structure.

This is one of the most important advantages of the present method, as compared to others described in the prior art.

It should be pointed out as well that provision of selective anodic oxidation, directed substantially transversally with respect to the layer surface, enables obtaining sidewalls of insulating alumina regions directed substantially perpendicularly to the layer surface. This is an additional advantage of the present invention.

The above described planarization step is indicated in FIG. 4 as a chemical process and the numeral 4 refers thereto.

After completion of the planarization step, the obtained structure is inspected to determine whether it satisfies relevant quality control requirements. If approved, the further steps of the process are effected.

Before describing these steps in more detail it should be mentioned, that the process can already be terminated after completing the above described main sequence of steps, if the required composite structure should not contain more than one layer, created in accordance with steps 2,3,4.

If, however, the composite structure is more complex and should include more layers, each of them consisting of insulating and conducting regions, defined by their individual patterns, the following additional sequence of steps is carried out.

Figure 9:

With reference to FIG. 9 the first step of the additional sequence is the depositing of a thin continuous electrically conductive layer 50, onto layer 20, so as to entirely cover the planarized oxidized and nonoxidized regions thereof. This step is designated in FIG. 4 as vacuum evaporation and the numeral 6 refers thereto. In practice layer 50 should have a thickness of 0,5–5 microns, preferably being 2 microns.

Despite this step being designated in FIG. 4 as vacuum evaporation it should be understood that this layer can be applied by any appropriate conventional thin film deposition method, provided that this method is capable of ensuring homogeneity of a film thickness and good adhesion thereof to the layer surface. As an example, of a suitable method one can mention CVD electron beam evaporation, sputtering deposition, or any other known-in-the-art processes which can be carried out within the environment of an appropriate gas or liquid.

Figure 10:
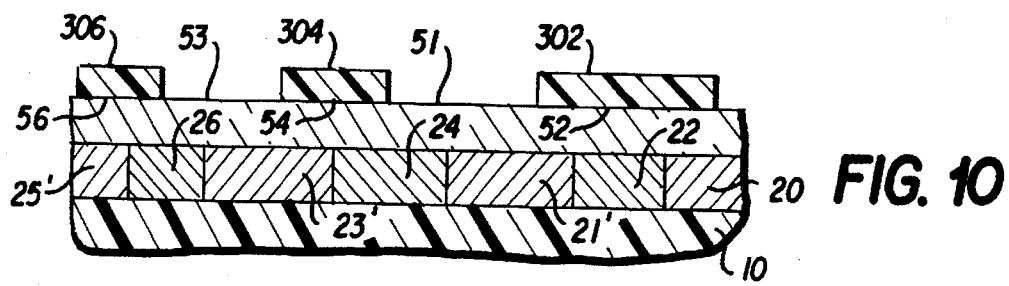
Figure 11:
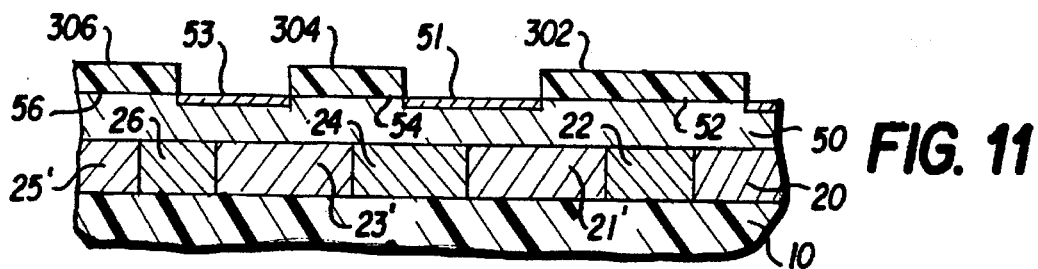

The next step, referring to an additional sequence, is masking of the surface of layer 50 by a second mask 300, having pattern regions 302,304,306, hiding respective locations 52,54,56 of layer 50, situated therebeneath (see FIG. 10).

The pattern of mask 300 is preferably different than that of the first mask 30. The masking step can be carried out by the same photolithography method, previously mentioned with reference to step 2 of the main sequence.

After completing the masking step, the selective oxidation step is carried out (see FIG. 11), followed by a chemical processing step, so as to remove the mask pattern regions and to achieve planarization of layer 50. These steps are carried out similarly to already described steps 3,4 which were mentioned with reference to the main sequence of steps.

Figure 12:
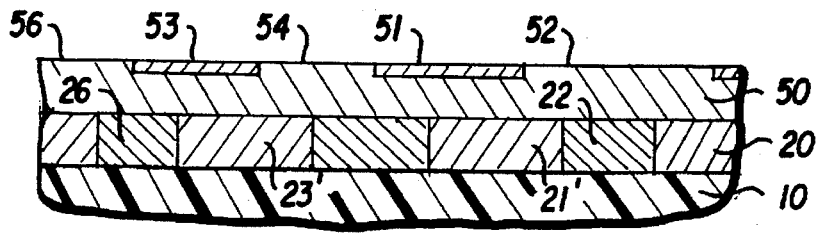

After completing masking and oxidation steps there is obtained a composite structure, shown in FIG. 12, defined by planarized adjacent layers 20,50, each of them comprising a plurality of insulating regions 21',23',25',51,53, interspersing with electrically conductive regions, 22,24,26,52,54,56 which were initially hidden by respective patterned regions of respective masks 30,300.

As seen in FIG. 12 in view of the provision of different patterns of mask 30 and 300 the regions 51,53, formed during selective oxidation of layer 50, are defined by lateral extensions and locations, which differ from those of respective insulating regions 21',23',25', formed during selective oxidation of layer 20.

Thus, the respective insulation regions formed within the adjacent initially continuous electrically conductive layers 20,50 are not aligned therebetween. It can be seen, for example, that insulating region 51 of layer 50 overlap with adjacent conductive region 22 and insulating region 21' of layer 20, while insulating region 53 of layer 50 overlaps with conductive region 26 and insulating region 23' of layer 20.

As an alternative to this embodiment it is possible to choose the mask pattern of mask 300 in such a manner, that at least part of the exposed locations of layer 50 will be aligned with the conductive regions of the previously oxidized layer 20. This provision effects the selective postoxidation of layer 20, thus converting respective initially conductive regions thereof into insulating regions.

Seeing that in this embodiment the insulating regions formed within adjacent layers will be aligned therebetween they will constitute a mutual region, extending transversally over all layers.

This embodiment is shown, for example in FIG. 14, where lateral extremity 80 of insulating region 70 extends transversally and in fact merges with adjacent insulating region 90, created in the upper layer.

It can be understood, that a similar arrangement can be effected with respect to the conductive regions, thus enabling the creation of vias within the structure.

It can be readily appreciated, that photolithography, oxidation and chemical processing steps, employed in the additional sequence of steps constitute the same main sequence of steps, which was described above. The additional sequence of steps can be resumed a number of times, if required, so as to achieve even more complex composite structures, consisting of several layers, each of them being defined by interspersing insulating and conductive regions, arranged in accordance with an individual pattern. At the same time it can be readily appreciated that the entire process is simple and does not include additional measures, which could reduce its production yield.

Figure 13:
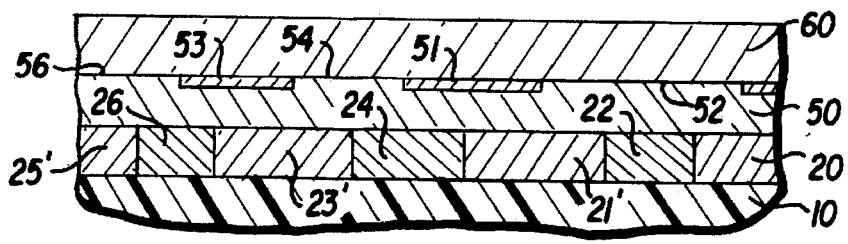

It should be noted, that each time when an additional sequence of steps is resumed, this sequence is started from the deposition of a continuous electrically conductive layer onto a planarized layer, formed after completing the preceding sequence of steps. This situation is shown in FIG. 13, where the third initially continuous electrically conductive layer 60 is applied onto layer 50, consisting of insulating regions 51,53, planarized with adjacent conductive layers 52,54,56.

Corresponding masking, oxidation and planarization steps are designated in FIG. 4 as photolithography, oxidation and chemical processing.

It should be understood that these steps are resumed only after the structure, resulted from the preceding additional sequence of steps, has been inspected and approved.

Now the selective anodic oxidation step will be described in more detail. The description will refer to anodic oxidation of electrically conductive layer made of aluminium, and to conversion of selected locations thereof into insulating alumina regions.

The electrical parameters of the selective anodic oxidation step are chosen so as to create, within adjacent layers a plurality of alumina regions, having different thicknesses sad densities. It should be understood that by thickness is meant the transverse extension of an alumina region in a direction from the upwardly facing surface of respective aluminium layer towards the depth thereof. In practice anodic oxidation in accordance with the present invention enables the creation of to types of alumina regions:

- alumina regions, defined by a relative porous structure, however still sufficient for providing the required insulating properties,
- alumina regions, defined by a dense structure, constituting a barrier, protecting conductive regions of preceding layer from oxidation process, currently taking place within the adjacent upper layer.

As will be explained further, a particular type of alumina region can be achieved deliberately depending on the chosen electrical parameters of anodic oxidation.

In contrast to known methods of MCM manufacturing, implementing strong acids or other dangerous chemicals, e.g. fluoric acid, the present invention employs an electrolytic solution of weak acid, e.g., boric acid, formic acid, citric acid, acetic acid or their combination. These solutions are usually not harmful and are more convenient to use.

In practice, porous alumina regions are formed within the first initially continuous electrically conductive layer, when the substrate itself serves as such a layer, while dense alumina regions are created within additional layers, arranged thereon.

It should be understood, however, that porous or dense alumina regions can be deliberately created within each and every additional layer of the structure. Porous or dense regions can reside therein both solely or in combination.

Figure 16:
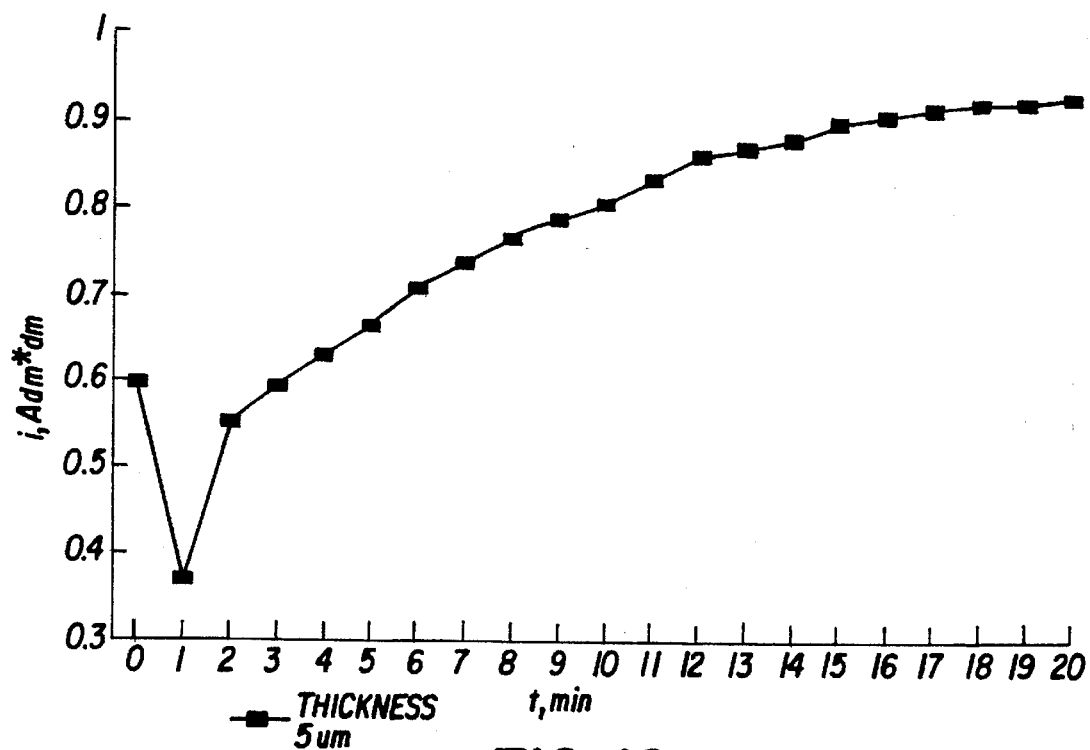
FIGS. 16–17 show how electrical parameters of selective oxidation are varied in accordance with the present invention so as to achieve nonconductive regions, defined by different density.

Conditions of anodic oxidation, resulting in porous alumina regions, created within the first initially continuous aluminium layer will now be described in the following non-limiting example 1 and with reference to FIG. 16.

EXAMPLE 1

Multicomponent electrolytic solution was prepared from oxalic acid, having concentration 70 g/liter citric acid, having concentration 40 g/liter boric acid, having concentration 16 g/liter The above components were mixed in 1:1:1 proportion so as to achieve an electrolytic solution having pH=1,5.

Anodic oxidation of masked aluminium layer, immersed into the above described electrolytic solution was carried out in two steps:

a) by stepwise increasing of voltage with gradient 1–2 v/sec from 0 v up to app. 40 v for app. 40 sec.

b) by oxidation at constant voltage of app. 40 v for approximately 10–30 min until establishment of current density in the range of 1–2 amper/dm$^2$, corresponding to formation of porous alumina regions, transversely extending in depth of aluminium layer by app. 2–3 microns.

It should be understood, that by virtue of anodic oxidation, effected in accordance with the present invention one can obtain porous alumina regions, extending in depth of the first aluminium layer by more than 2–3 microns.

This can be achieved, if the above described anodic oxidation step b) is effected for a period of time sufficient for formation of alumina regions with the required thickness. Alternatively, one can use, as an indication for termination of anodic oxidation, the establishing of current density less, than 8–9 milliamper/dm$^2$. In practice, porous alumina regions with thicknesses up to 20 microns can be obtained, provided that the thickness of first initially continuous aluminium layer is sufficient for such deep oxidation. It should be pointed out that this is another significant advantage of the present invention, since the thickness of insulating regions, achievable in the known methods, is limited by several microns.

Oxidation of additional aluminium layers is carried out similarly to the above described, if there is required to create alumina regions having a particular thickness, which is less than that of the respective aluminium layer.

It should be realized, that oxidation of the entire bulk of the respective additional aluminium layer is also possible and can be easily achieved, if the oxidation step is maintained until establishment of zero current density.

Figure 17:
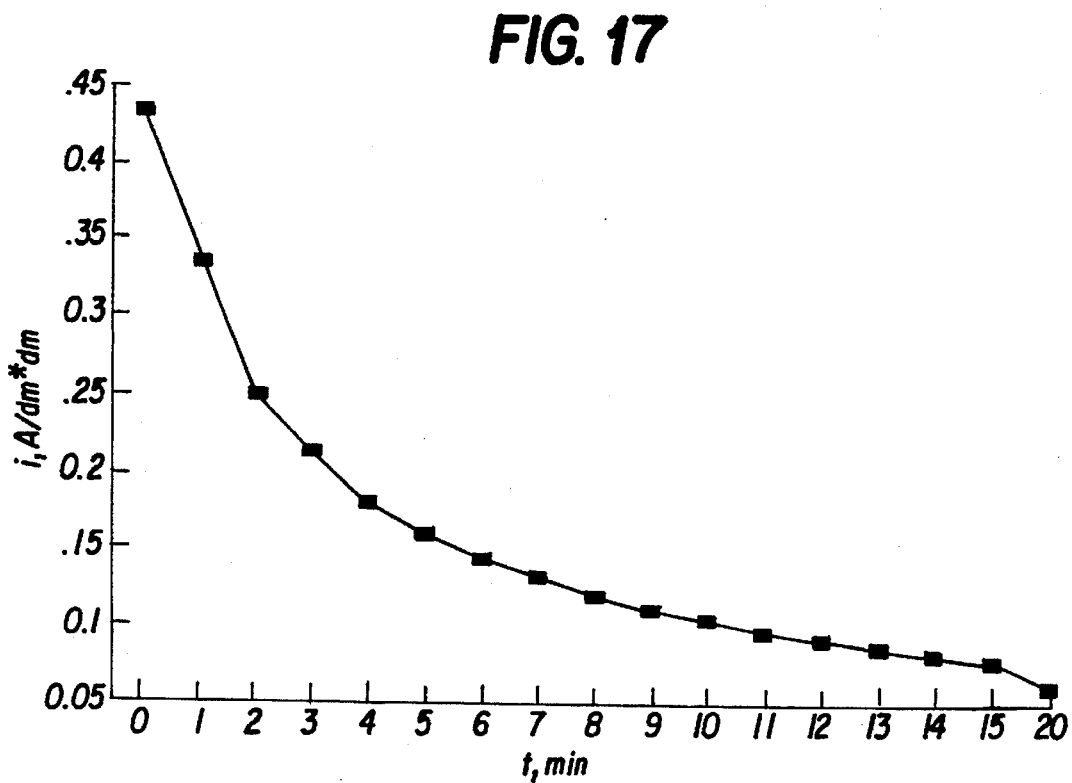

With reference to non-limiting Example 2 and FIG. 17 it will now be explained how alumina regions defined by dense structures are created in accordance with the present invention.

EXAMPLE 2

A multicomponent electrolytic solution was prepared from citric acid with a concentration of 4 g/liter so as to achieve pH=2.

Anodic oxidation of additional initially continuous aluminium layer with thickness 0,02–0,05 micron was carried out in two steps:

a) by stepwise increasing of voltage with gradient 1–2 v/sec from 0 v up to 150–300 v for app. 5 min.

b) by oxidation at constant voltage 150–300 v for app. 20 min until current density decreased from app. 4 microamper/dm$^2$ up to 0,05–0,07 amper/dm$^2$. This current density is associated with the formation of dense alumina regions, having thicknesses of 0,02–0,07 microns, preferably being 0,05 micron.

It has been found that despite the relatively insignificant thickness of dense alumina regions (0,05–0,07 micron), compared to the total thickness of the additional aluminium layer (app. 2 microns) the density of these regions is, nevertheless, sufficient to prevent expansion of the oxidation process into an adjacent layer situated thereunder.

Figure 15:
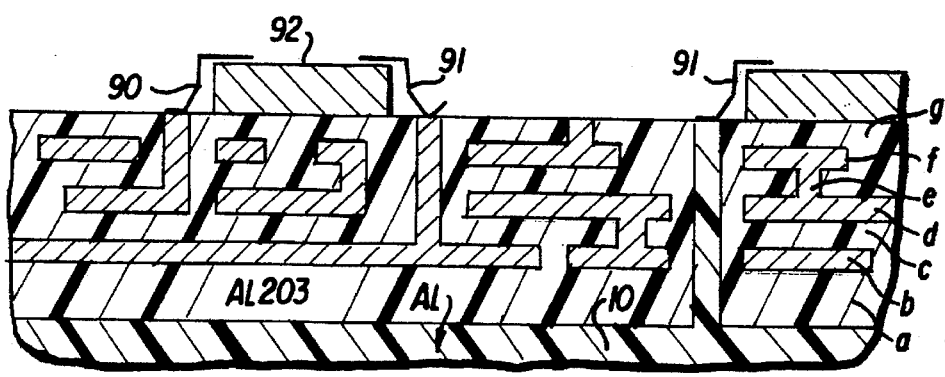
FIG. 15 is a schematic presentation of the composite structure of an MCM-D, fabricated in accordance with the present invention.

The resulting composite structure, obtained after multiple repetition of the above described additional sequence of steps is presented in FIG. 15. The structure shown in this fig. is defined by substrate 10, having formed thereon a plurality of adjacent layers a,b,c,d,e,f,g. Each of these layers consists of transversely extending insulating alumina regions, interspersing with conductive aluminium regions.

By using different masks for respective layers one can arrange regions in such a manner, that aluminium regions, belonging to adjacent layers will merge. This embodiment, refers to vias 90, created by merging conductive regions belonging to adjacent layers.

It will now be explained how the composite structure formed in accordance with the present invention can be advantageously implemented as an MCM-D.

Figure 18:
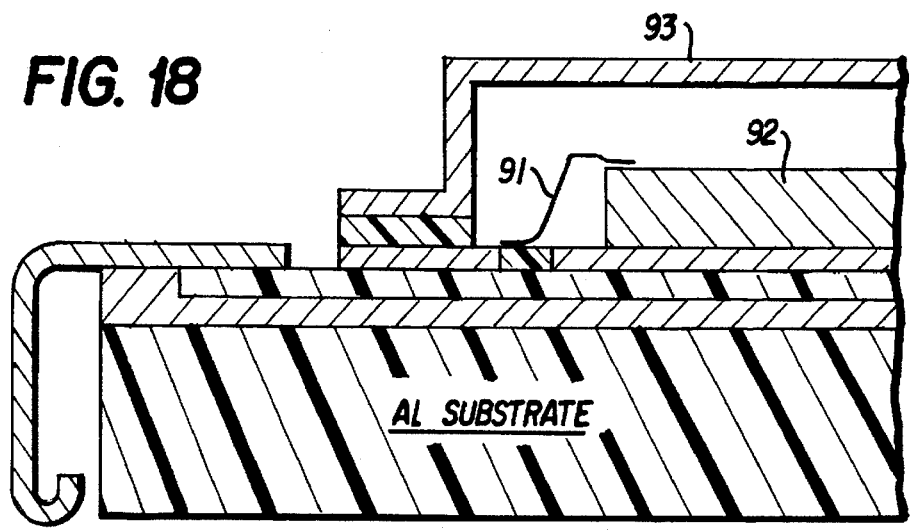
FIG. 18 is a partial view of an MCM-D, fabricated in accordance with the present invention, enclosed within dedicated packaging.
Figure 6:
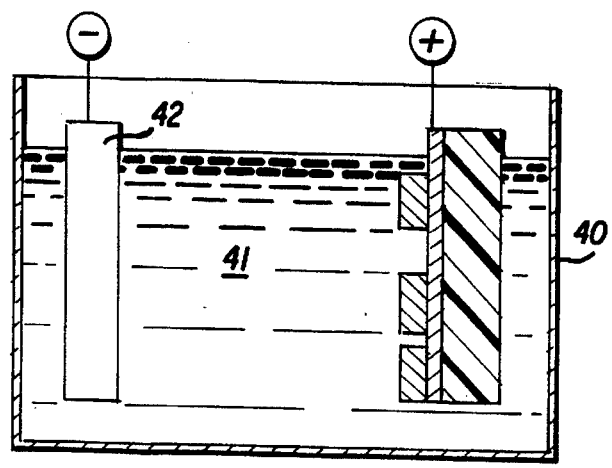
FIG. 6 shows how selective anodic oxidation is carried out within the appropriate galvanic vessel.
Figure 7:
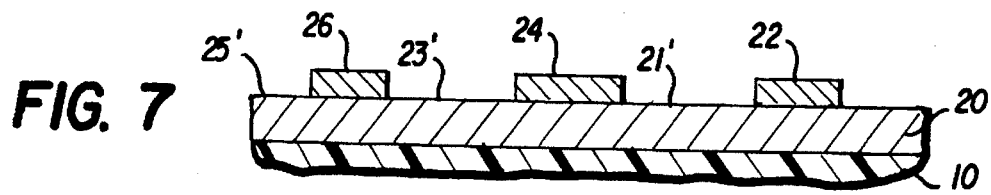
FIGS. 7–14 show the consequent steps of the method, resulting in obtaining a composite structure in accordance with the present invention.

With reference to FIG. 18 an MCM-D is shown, comprising the above-described composite structure together with appropriate semiconducting devices 92, mounted on the upper layer thereof.

These devices are electrically connected with respective vias by inside bonding 91; the entire MCM-D is enclosed within an appropriate dedicated package 93.

Figure 3:
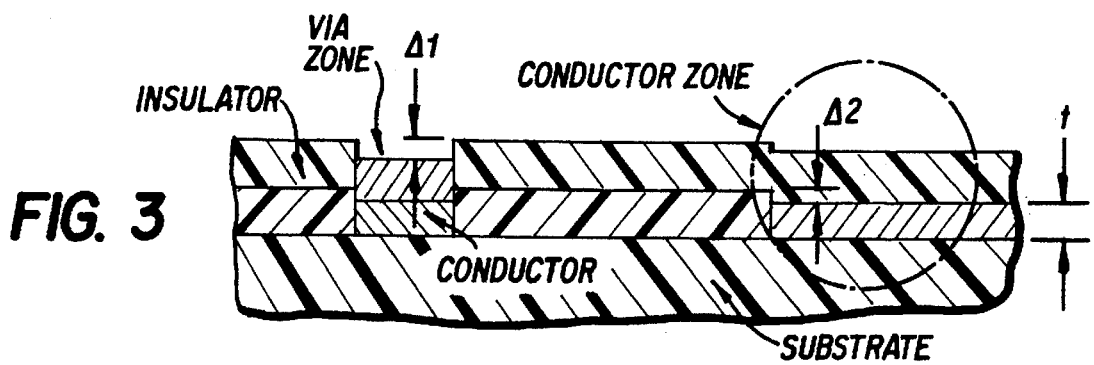
FIG. 3 schematically shows planarity-related structural parameters of two layer MCM-D structure in accordance with the present invention.

With reference to FIG. 3, it can be readily appreciated that, by virtue of selective oxidation, directed substantially from the outwardly facing surface of respective aluminium layer in depth thereof the resulting structure is inherently defined by improved planarity of each layer. The degree of planarity, defined earlier by parameters Δ1 and Δ2 is presented in nonlimiting table 2 below, summarizing these parameters for conventional MCM-D's and for the present invention.

In this table PI refers to MCM-D, manufactured in accordance with polyimide technology, SiO2 refers to MCM-D, manufactured by SiO2 deposition method and AlOX designates MCM-D, fabricated in accordance with the present invention.

TABLE 2

| Type | Δ1 (micron) | Δ2 (micron) | t (micron) | PDv (%) | PDc (%) |
|---|---|---|---|---|---|
| PI | 20 | 0.5–1.5 | 2 | 1000 | 25–75 |
| SiO$_2$ | 10 | 2 | 2 | 500 | 100 |
| AlOX | 0.4 | 0.15–0.2 | 2 | 20 | 7–10 |

Looking at table 2 one can clearly see the superior planarity of the AlOX structure:

PDv equals 20% versus 500% (SiO2 deposition method) and 1000% (PI method), while PDc equals 7–10% versus 25–75 or 100%, achieved by conventional manufacturing methods.

The high degree of planarity imparts to MCM-D's, manufactured in accordance with the present invention better resolution, increased connectivity density and improved performances.

Nonlimiting table 3 below compares some data, referring to performances of MCM-D's, produced by conventional methods and in accordance with the present invention.

TABLE 3

|  | MCM-D (PI) | MCM-D (Si) | MCM-AlOX-D |
|---|---|---|---|
| Line width (micron) | 25 | 10 | 10 |
| Line pitch (micron) | 50 | 25 | 25 |
| Via size (micron) | 25 | 25 | 10 |
| Via pitch (micron) | 75(A) | 50(B) | 25(C) |
| Dielectric constant | 3(D) | 4(E) | 7(F) |
| Line resistivity (mΩ/O) at nominal thickness | 5(CU) (G) | 15(Al) (H) | 15(Al) (I) |
| Number of layers capability | 5 | 4 | 4 |
| Number of usable layers for routing (number of layers without power, ground and top layers) | 2 (J) | 1 (L) | 2 (M) |
| Real usable wiring density | 1 | 1.1$^{(a)}$ | $^{(b)}$ |
| Propagation delay | 1 | .77$^{(c)}$ | .51$^{(d)}$ |
| Resistivity | 1 | 2$^{(e)}$ for Al | 1$^{(f)}$ for Al |

(a) - (A/B)$^2$*(L/J)
(b) - (A/C)$^2$*(M/J)
(c) - (B/A)*(E/D)$^{.5}$
(d) - (C/A)*(F/D)$^{.5}$
(e) - (B/A)*(H/G)
(f) - (C/A)*(I/G)

In this table MCM-D (PI) refers to polyimide method, MCM-D(Si) refers to SiO2 deposition method and MCM-AlOX-D refers to the selective anodic oxidation method in accordance with the present invention.

From this table one can clearly see that MCM-D, having a composite structure in accordance with the present invention, has improved performances.

It is not shown in the drawings, but it should be understood, that instead of using a dedicated package, one can also form it integrally with the composite structure. This can be done once the mask patterns are chosen so as to form a combined substrate and package structure. The advantage of this embodiment is associated with improved heat dissipation due to improved thermal conductivity of alumina/aluminium combination. Heat dissipation can be improved even more, if the substrate is made of single aluminium piece instead of depositing aluminium or other metallic layer onto ceramic substrate. This embodiment can be especially relevant for MCM-D's, employing semiconducting devices, generating a substantial amount of heat during their functioning.

The present invention should not be limited to the above preferred embodiments, referring to MCM-D's per se. It should be mentioned, that the method and composite structure, manufactured thereby can be implemented in other electronic devices, in which improved planarity, increased connection density and heat transfer can be of importance. It should be understood also, that changes and modifications can be made by one ordinarily skilled in the art, without deviation of the scope of the invention, as it will be defined below in the appended claims.

At the same time it should be appreciated, that features disclosed in the foregoing description in the following claims and/or in the accompanying drawings, and/or examples and tables, both separately and in any combination thereof, may be material for realizing the present invention in diverse forms thereof.

I claim:

1. A composite structure for use in different electronic devices, said structure comprising:

a first layer comprising a plurality of electrically conductive regions interspersing with electrically non-conductive regions, said regions extending laterally and transversely within said first layer in accordance with a preselected pattern, wherein said electrically conductive regions are made of metallic material and said electrically non-conductive regions constitute a product of conversion of said metallic material in electrically non-conductive form thereof, and wherein said conductive and non-conductive regions extend in a depth of said layer, substantially transversely with respect to an outwardly facing surface thereof, and are substantially co-planar therebetween;

a substrate made of one of ceramic and non-ceramic material, wherein said first layer is arranged on said substrate; and at least one additional layer having a thickness less than a thickness of said first layer, said at least one additional layer comprising a combination of electrically non-conductive regions interspersing with electrically conductive regions, said regions being arranged in a further preselected pattern which differs from said preselected pattern of said first layer, and wherein a density of at least some of said non-conductive regions of said at least one additional layer exceeds a density of said non-conductive regions of said first layer.

2. A composite structure as recited in claim 1, comprising a D-type substrate for a multi-chip module, wherein at least some of the electrically conductive regions formed within adjacent layers are arranged so as to provide vias.

3. A composite structure as recited in claim 1, wherein some of the electrically conductive regions and the electrically non-conductive regions comprise a package of a multi-chip module, and wherein said package is formed substantially integrally with said substrate.

4. A composite structure as recited in claim 1, wherein some of the electrically conductive regions comprise a package of a multi-chip module, and wherein said package is formed substantially integrally with said substrate.

5. A composite structure as recited in claim 1, wherein some of the electrically non-conductive regions comprise a package of a multi-chip module, and wherein said package is formed substantially integrally with said substrate.

* * * * *